United States Patent [19]

Vig

[11] Patent Number: 5,488,333
[45] Date of Patent: Jan. 30, 1996

[54] WIRELESS THERMALLY INSULATED CRYSTAL OSCILLATOR HAVING POWER AND SIGNALS COUPLED THROUGH TRANSCEIVERS

[75] Inventor: John R. Vig, Colts Neck, N.J.

[73] Assignee: The United States of America as represented by the Secretary of the Army, Washington, D.C.

[21] Appl. No.: 418,979

[22] Filed: Apr. 7, 1995

[51] Int. Cl.⁶ ............................. H03B 5/32; H03L 1/04
[52] U.S. Cl. ................ 331/66; 331/69; 331/74; 331/158; 331/176; 331/185; 455/73
[58] Field of Search ............................. 331/66, 68, 69, 331/74, 158, 176, 185; 455/73

[56] References Cited

U.S. PATENT DOCUMENTS

| | | | |
|---|---|---|---|
| 4,874,252 | 10/1989 | Ziegler et al. | 331/68 |
| 5,339,051 | 8/1994 | Koehler et al. | 331/65 |

OTHER PUBLICATIONS

Symonds, D. A., et al "An Update on the TMXO", Forty-Fourth Annual Symposium on Frequency Control, 1990, IEEE pp. 615-621.

Brown, D., et al "Manufacturing Methods and Technology For Tactical Miniature Crystal Oscillator", 38th Annual Frequency Control Symposium, 1984, IEEE. pp. 380-386.

*Primary Examiner*—Siegfried H. Grimm
*Attorney, Agent, or Firm*—Michael Zelenka; William H. Anderson

[57] ABSTRACT

An oscillator is isolated from external mechanical and thermal effects by surrounding the oscillator on all sides with a thermally insulating medium such as an aerogel insulation structure that provides both thermal insulation and vibrational isolation. Power is supplied to the crystal oscillator without wires. Wires are eliminated by using modulated microwaves or millimeter waves to transmit power and signals into and out of the oscillators, such as with small, efficient transceivers utilizing microwave or millimeter-wave integrated circuits or use of solid-state light sources and photodetectors in combination with thermal insulation which is transparent to the wavelengths of the electromagnetic radiation.

20 Claims, 1 Drawing Sheet

5,488,333

WIRELESS THERMALLY INSULATED CRYSTAL OSCILLATOR HAVING POWER AND SIGNALS COUPLED THROUGH TRANSCEIVERS

GOVERNMENT INTEREST

The invention described herein may be manufactured, used, and licensed by or for the U.S. Government without the payment to me of any royalties thereon.

RELATED APPLICATION

The present application is related to a co-pending application by the same inventor, given U.S. Ser. No. 08/366,121, entitled "Isolating an Oscillator from External Mechanical and Thermal Effects," filed Dec. 29, 1994, and having an attorney docket number, CECOM4652.

BACKGROUND OF THE INVENTION

1. Field of the Invention

The present invention pertains to the field of frequency control and in particular to an improved method of enclosing and supplying power to a crystal oscillator.

2. Description of the Prior Art

Crystal oscillators are used in controlling the frequencies of nearly all electronic devices. The main frequency and frequency stability determining element in crystal oscillators is the crystal resonator. It is known that a crystal resonator's resonance frequencies change with temperature. In the highest stability crystal oscillators, the resonator temperature is kept constant in an oven. The principal drawback of such oven controlled crystal oscillators (OCXO) is the power requirement, which usually prevents the use of OCXOs in battery operated equipment. The lower the operating temperature of the OCXO the more power that is required to maintain a constant oven temperature. Power requirements of commercially available OCXOs are typically in the range of 1 to 6 watts. Designers of OCXOs strive to minimize the power requirements by using low thermal conductivity materials, such as foam insulators, to isolate the oven from the environment and by minimizing heat losses through electrical leads. For battery operated equipment, the desired input power requirement is less than 100 milliwatts. See, for example, Frerking, Marvin E., "Crystal Oscillator Design and Temperature Compensation", Van Nostrand Reinhold Company, New York for a brief description of oven controlled crystal oscillators.

The best thermal insulator is a vacuum, together with appropriately finished surfaces in the oven to minimize heat losses by means of radiation. The tactical miniature crystal oscillator (TMXO), for example, uses a vacuum for thermal insulation, however, using a vacuum results in some undesirable side effects. The major side effects are resonances in the mounting structure and high manufacturing costs due to the complexity of assembly. Part of the complexity results from the necessity for electrical leads which must extend from the components in the oven, through the thermal insulation to a connector on the outside of the oscillator enclosure. Supporting an oscillator in a vacuum insulated enclosure requires difficult tradeoffs between minimizing heat losses through the supporting structure and electrical leads and providing a sufficiently rigid structure for the vibration resonances to be inconsequential. Complex arrangements of wires and thin-walled tubes have been used in the TMXO in attempts to strike a balance between the conflicting requirements. Prior art attempts have been only partially successful. In this regard, see Symonds, D.A, et al "An Update on the TMXO", Forty-Fourth Annual Symposium on Frequency Control," 1990, IEEE; and Brown, D., et al "Manufacturing Methods and Technology For Tactical Miniature Crystal Oscillators, 38th Annual Frequency Control Symposium," 1984, IEEE.

Ideally, it would be desired to completely isolate an oscillator from external mechanical and thermal effects such as by suspending the oscillator in an ultrahigh vacuum in some fashion. Such a complete isolation is not possible on earth where one must apply forces to the oscillator to counteract the force of gravity. In addition, in the prior art, electrical leads were always used to supply power to the oven and oscillator circuitry, and for extracting the signal from the oscillator. It is an object of the invention to provide an improved method of supplying power to a crystal oscillator by transmitting power to the oscillator without wires.

SUMMARY OF THE INVENTION

The invention provides a wireless oscillator device which comprises an oscillator, first wireless transceiver means cooperating with the oscillator and being capable of wireless reception of power and wireless reception and transmission of signals through a thermally insulating medium; said oscillator and first wireless transceiver means being enclosed and surrounded on all sides with a thermally insulating medium sufficient to provide thermal insulation of the oscillator from ambient surroundings; and second wireless transceiver means positioned spaced from the first wireless transceiver means and being capable of the wireless transmission of power and wireless reception and transmission of signals through the thermally insulating medium to the first wireless transceiver means.

The invention also provides a method of using an oscillator which comprises providing the above described wireless oscillator device and then radiating electromagnetic power or an electromagnetic signal from the second wireless transceiver means through the thermally insulating medium to the first wireless transceiver means and then to the oscillator.

The invention further provides a method of forming a wireless oscillator device which comprises positioning an oscillator having first wireless transceiver means cooperating with the oscillator and being capable of wireless reception of power and wireless reception and transmission of signals through a thermally insulating medium; positioning said oscillator and first wireless transceiver means in an enclosure surrounded on all sides with a thermally insulating medium sufficient to provide thermal insulation to the oscillator; and positioning second wireless transceiver means spaced from the first wireless transceiver means, said second wireless transceiver means being capable of the wireless transmission of power and wireless reception and transmission of signals through the thermally insulating medium to the first wireless transceiver means.

DETAILED DESCRIPTION OF THE PREFERRED EMBODIMENT

Figure 1:
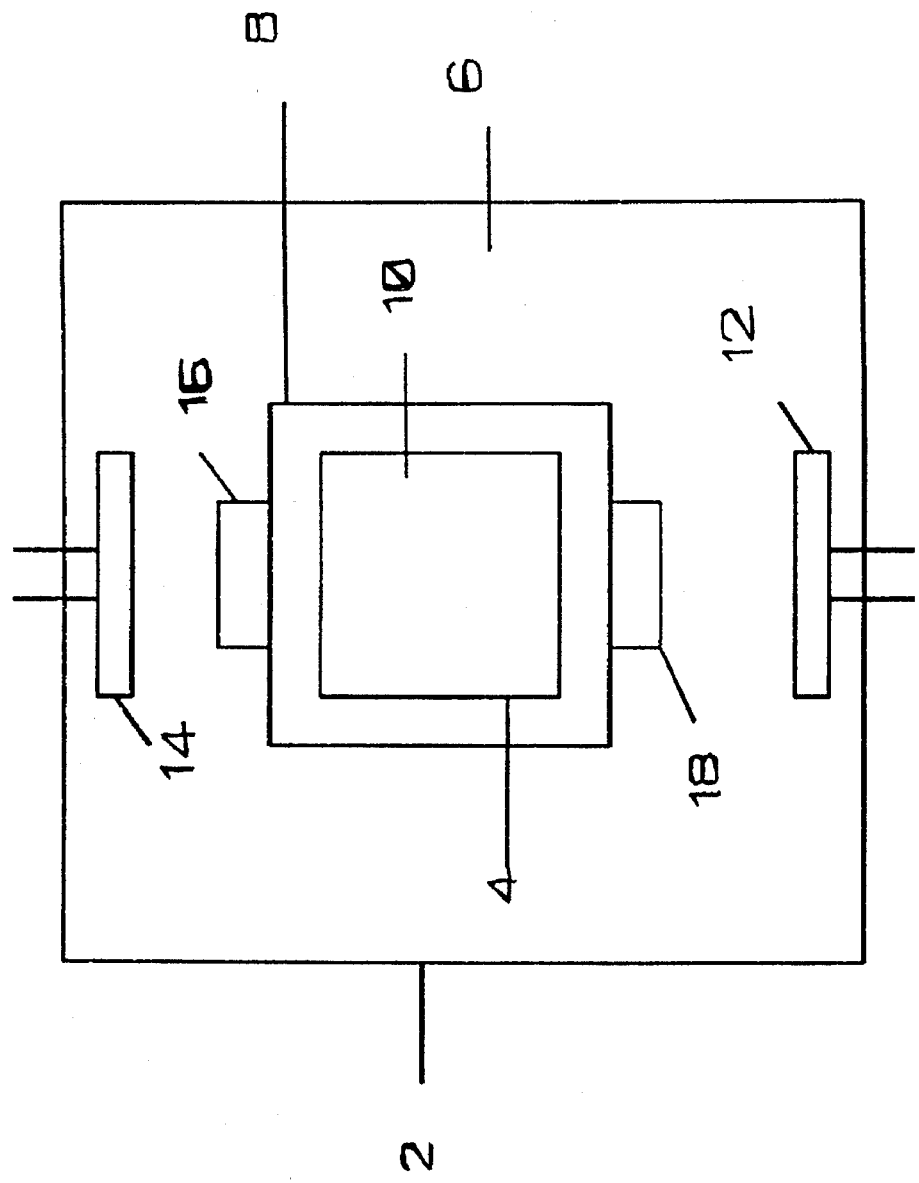
FIG. 1 is a schematic representation of a wireless, enclosed crystal oscillator according to the invention.

In the prior art, electrical leads are required for getting power into the oscillator and the signal out of the oscillator, the ground connection and built-in-testing wires. These wires are a source of such problems as heat losses, stray reactances, fabrication complexities, and failure mechanisms. It would, therefore, be highly desirable to eliminate as many of these wires as possible. The present invention eliminates the use of wires. One method of eliminating wires is to use modulated microwaves or millimeter waves to transmit power and signals into and out of the oscillators. This can be accomplished with small, highly efficient transceivers utilizing microwave or millimeter-wave integrated circuits. The oscillator has a first wireless transceiver and is embedded in a thermal insulating medium. Spaced from the first wireless transceiver is a second wireless transceiver. The thermal insulation must be transparent to the wavelength of the electromagnetic radiation transmitted between the two transceivers. Such may be microwave, millimeter wave or lightwave energy.

An example of one method of eliminating wires is to use solid-state light sources and photodetectors in combination with a thermal insulation medium such as aerogels which are transparent to the wavelengths of the light source. Aerogels are high strength, highly porous, ultralight materials which are well known in the art. The density of aerogels can be adjusted over a wide range, from about three times the density of air to about 700 times that of air. Because of their remarkably labyrinthine and diaphanous interiors, aerogels are excellent thermal insulators. Aerogels are also very strong, being able to support 1,600 times its weight. This combination of high strength and low thermal conductivity makes aerogels a nearly ideal material for enclosing crystal oscillators, especially when the oscillator is small and light weight. The aerogels form a resilient cushion which can also isolate the oscillator from vibration. When a load is applied, internal friction in the aerogels provides damping of the vibration. Surrounding a crystal oscillator on all sides with the proper insulation structure can provide both thermal insulation, and vibration isolation above some low frequency limit which depends on the mass of the oscillator and the nature of the insulation structure. The aerogels may be in an evacuated enclosure, or in an enclosure that is backfilled with a heavy gas, such as xenon, to minimize the thermal conductivity due to the gas. When the acceleration sensitivity at and below the low frequency limit adversely affects a system's performance, vibration compensation, as described in U.S. Pat. No. 4,453,141, which is incorporated herein by reference, can be used to alleviate the problem.

Another embodiment of the invention uses aerogels of multiple stiffnesses in order to achieve nonlinear isolation characteristics. Such characteristics are desirable in situations where the acceleration produces a large deflection, at low vibration frequencies and at high acceleration levels. In small OCXO enclosures, low vibration frequencies and high acceleration levels would make the oscillator bump into the sides of the enclosure. Such shocks, which are highly undesirable, can be minimized by the use of aerogels the effective "spring constants" of which increase with distance between the oscillator and the oscillator enclosure, that is, the spring constant is maximum at the enclosure wall and minimum at the oscillator. Aerogels made of silica are transparent to a wide range of wavelengths from the ultraviolet to the infrared.

The solid state transceivers function to transmit power and signals into and out of the oscillators by means of electromagnetic waves rather than through wires. The emitter is a source of microwave, millimeter wave or lightwave energy, and the receiver is either a microwave or millimeter wave receiver or a photodetector based lightwave receiver. The size of the absorbers or antennas which are required to transmit and receive the signals are as appropriate to the desired design. For example, 10 GHz to 30 GHz microwaves are convenient to use because in this frequency range, the antenna dimensions can be about 1 cm or smaller.

Referring to FIG. 1, the preferred embodiment of the invention comprises an outer enclosure 2 and a combination of oscillator circuitry and an oven are represented by 10. The oscillator circuitry and oven are enclosed in an inner enclosure 4. The inner enclosure 4 is covered by a layer of radiation absorber 8, which is a material that absorbs the electromagnetic radiation emitted by at least one of the outer transceivers 12 and 14. This absorbed radiation is used to supply the heat necessary to maintain the oscillator circuitry in the oven at a constant temperature. Oscillator circuitry including the resonator and all other temperature sensitive components are constructed by means of art established methods. The volume is designed to be as small as possible and the shape of the oscillator circuitry would approximate the shape of a sphere to the extent possible to minimize the surface area and thereby minimize the power required to maintain the oscillator at a constant temperature. In one embodiment oscillator circuitry is set in a 1.5 cm diameter and 1 cm tall cylinder and the outer enclosure is a 2.5 cm diameter and 3 cm tall cylinder. Thermal insulation 6, which is transparent to the radiation emitted by the transceivers, fills the space between the outer enclosure 2, the radiation absorber 8 and inner transceivers 16 and 18. In one embodiment, the gap between the inner oscillator circuitry enclosure and the outer oscillator enclosure is filled with thermal insulation such as an aerogel. The inner and outer enclosures, 4 and 2 respectively, may be made of a material which reflects the radiation emitted by the transceivers, so as to insure that all the radiation emitted is eventually absorbed by the radiation absorbers. The invention comprises one or more outer transceivers 12 and 14 which are shown on or near the outer enclosure and one or more inner transceivers 16 and 18 which are shown on or near the inner enclosure.

The one or more inner transceivers 16 and 18 contain 1) means to absorb radiation emitted by at least one of the outer transceivers. This means can be, for example, a patch antenna, or an antenna array, of dimensions that are appropriate for detecting the radiation emitted by the outer transceiver; e.g., 10 GHz to 30 GHz is a convenient frequency range; 2) means to generate the power required to operate the oscillator; for example, by utilizing Schottky barrier diodes to generate the required voltage; 3) means to emit modulated electromagnetic radiation that contains information such as the oscillator's frequency, temperature, and test information. For example, the electromagnetic radiation emitted by the transceivers can be 20 GHz microwaves modulated at 10 MHz, the oscillator's frequency.

The one or more outer transceivers 12 and 14 contain: 1) means to emit electromagnetic radiation which the radiation absorber can absorb and thereby maintain the oscillator circuitry at a constant temperature, 2) means to emit electromagnetic radiation which the inner transceiver can detect, rectify, and use to supply power to the oscillator, 3) means to absorb the modulated radiation emitted by at least one of the inner transceivers; this means can, for example, be a patch antenna; and 4) means to extract the modulation signal, i.e., the oscillator signal. In the preferred embodiment, two sets of transceivers are used: the first set is used to supply heat for maintaining the oscillator circuitry at a constant temperature, and the second set is used to power the oscillator and to transmit the electrical signals needed to operate the oscillator.

The microwave emitters can be gallium arsenide or indium phosphide transistors. The power required for operating the oscillator can be generated by, for example, a technique similar to that described by J. O. McSpadden and Kai Chang, "A Dual Polarized Circular Patch Rectifying Antenna at 2.45 GHz for Microwave Power Conversion and Detection," on pages 1749 to 1752 of the 1994 IEEE MTT-S Digest. This technique resulted in a 48% DC output power to incident microwave power conversion efficiency. In the preferred embodiment, the transceivers used for power conversion would be separate from the transceivers used for the heating and temperature controlling of the oscillator circuitry.

When the electromagnetic radiation is microwaves or millimeter waves, the heat generating absorber can be a variety of materials. For example, it can be a carbon filled epoxy, or a carbon filled polymer foam, such as Eccosorb LS, sold by Emerson & Cuming, Inc., Canton, Mass. Although highly efficient microwave transceivers are available, the generation process always results in wasted heat generation. In this invention, however, the heat is not wasted but is used to maintain the oscillator circuitry at a constant temperature.

One way to assemble the oscillator is to make the outer enclosure of two half-cylinders, suspend in each half-cylinder an inner enclosure which is the same size and shape as the inner enclosure with its absorber covering and transceivers, fill the spaces between the half-cylinders and the inner enclosures with thermal insulation such as aerogels by means of art established methods, remove the inner cylinders, place the inner enclosure and its associated absorber and transceivers into one of the half cylinders, and join the second half-cylinder to the first so as to form a hermetically sealed enclosure in which the oscillator circuitry is surrounded by the thermal insulation. On the outside surface of the inner oscillator circuitry enclosure, and the inside surface of the outer oscillator enclosure are located one or more transceivers for the required signals. Attached to the outer cylinder can be a pinch-off tube through which the air in the thermal insulation can be evacuated and back-filled so as to minimize the heat losses through the aerogels. In one embodiment, the space would be evacuated and the tube would be pinched off or otherwise sealed so as to leave the thermal insulation in a vacuum. In another embodiment, the space would be evacuated and back-filled with xenon. Although heat losses through xenon are higher than the losses through a vacuum, xenon backfilling results in a less stringent requirement on hermeticity and outgassing than the vacuum embodiment.

What is claimed is:

1. A wireless oscillator device which comprises an oscillator, first wireless transceiver means cooperating with the oscillator and being capable of wireless reception of power and wireless reception and transmission of signals through a thermally insulating medium; said oscillator and first wireless transceiver means being in an enclosure and surrounded on all sides with a thermally insulating medium sufficient to provide thermal insulation of the oscillator from ambient surroundings; and second wireless transceiver means positioned spaced from the first wireless transceiver means and being capable of the wireless transmission of power and wireless reception and transmission of signals through the thermally insulating medium to the first wireless transceiver means.

2. The wireless oscillator device of claim 1 wherein the thermally insulating medium is evacuated.

3. The wireless oscillator device of claim 1 wherein the thermally insulating medium comprises an aerogel medium.

4. The wireless oscillator device of claim 3 wherein the aerogel medium comprises a plurality of aerogels having different stiffnesses.

5. The wireless oscillator device of claim 4 wherein the aerogel medium comprises a plurality of aerogels having different stiffnesses such that the stiffness is maximum at a wall of the enclosure and minimum at the oscillator.

6. The wireless oscillator device of claim 3 wherein the aerogel surrounding the oscillator is in an enclosure that is backfilled with a heavy gas.

7. The wireless oscillator device of claim 6 wherein the heavy gas is xenon.

8. The wireless oscillator device of claim 1 wherein the first and second transceiver means comprise means to transmit modulated microwave or millimeter wave power and signals into and out of the oscillator, and wherein the thermally insulating medium is substantially transparent to the wavelengths of the microwave or millimeter wave transmission.

9. The wireless oscillator device of claim 1 wherein the first and second transceiver means comprise light transmission and light detector means, and wherein the thermally insulating medium is substantially transparent to the wavelengths of the light transmission.

10. A method of forming a wireless oscillator device which comprises positioning an oscillator having first wireless transceiver means cooperating with the oscillator and being capable of wireless reception of power and wireless reception and transmission of signals through a thermally insulating medium; positioning said oscillator and first wireless transceiver means in an enclosure surrounded on all sides with a thermally insulating medium sufficient to provide thermal insulation to the oscillator; and positioning second wireless transceiver means positioned spaced from the first wireless transceiver means, said second wireless transceiver means being capable of the wireless transmission of power and wireless reception and transmission of signals through the thermally insulating medium to the first wireless transceiver means.

11. The method of claim 10 wherein the thermally insulating medium is evacuated.

12. The method of claim 10 wherein the thermally insulating medium comprises an aerogel medium.

13. The method of claim 12 wherein the aerogel medium comprises a plurality of aerogels having different stiffnesses.

14. The method of claim 12 wherein the aerogel medium comprises a plurality of aerogels having different stiffnesses such that the stiffness is maximum at a wall of the enclosure and minimum at the oscillator.

15. The method of claim 12 wherein the aerogel surrounding the oscillator is an enclosure that is backfilled with a heavy gas.

16. The method of claim 15 wherein the heavy gas is xenon.

17. The method of claim 10 wherein the first and second transceiver means comprise means to transmit modulated microwave or millimeter wave power and signals into and out of the oscillator, and wherein the thermally insulating medium is substantially transparent to the wavelengths of the microwave or millimeter wave transmission.

18. The method of claim 10 wherein the first and second transceiver means comprise light transmission and light detector means, and wherein the thermally insulating medium is substantially transparent to the wavelengths of the light transmission.

19. A method of using an oscillator which comprises:

a.) providing a wireless oscillator device which comprises an oscillator, first wireless transceiver means cooperating with the oscillator and being capable of wireless reception of power and wireless reception and transmission of signals through a thermally insulating medium; said oscillator and first wireless transceiver means being enclosed and surrounded on all sides with a thermally insulating medium sufficient to provide thermal insulation of the oscillator from ambient surroundings; and second wireless transceiver means positioned spaced from the first wireless transceiver means and being capable of the wireless transmission of power and wireless reception and transmission of signals through the thermally insulating medium to the first wireless transceiver means; and b.) radiating electromagnetic power or an electromagnetic signal from the second wireless transceiver means through the thermally insulating medium to the first wireless transceiver means and then to the oscillator.

20. The method of claim 19 wherein the first and second transceiver means are selected from the group consisting of a and b:

a.) means to transmit modulated microwave or millimeter wave power and signals;

b.) light transmission and light detector means, and wherein the thermally insulating medium is substantially transparent to the wavelengths of the light transmission.

* * * * *